United States Patent
Cok

(10) Patent No.: US 6,819,036 B2
(45) Date of Patent: Nov. 16, 2004

(54) OLED LIGHTING APPARATUS

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 53 days.

(21) Appl. No.: 10/156,276

(22) Filed: May 28, 2002

(65) Prior Publication Data

US 2003/0222558 A1 Dec. 4, 2003

(51) Int. Cl.$^7$ ................................. H01J 5/48
(52) U.S. Cl. ........................ 313/318.01; 313/318.07; 313/313.09; 313/498
(58) Field of Search .................. 313/498, 512, 313/318.01, 318.07, 318.09, 3

(56) References Cited

U.S. PATENT DOCUMENTS

| | | | |
|---|---|---|---|
| 4,626,742 A | * 12/1986 | Mental | ........................ 313/503 |
| 4,769,292 A | 9/1988 | Tang et al. | |
| 5,061,569 A | 10/1991 | VanSlyke et al. | |
| 5,667,394 A | 9/1997 | Chien | |
| 6,168,282 B1 | 1/2001 | Chien | |
| 6,274,978 B1 | 8/2001 | Roach et al. | |
| 6,527,400 B2 * | 3/2003 | Dickie et al. | .................. 362/84 |
| 6,538,375 B1 * | 3/2003 | Duggal et al. | .............. 313/506 |
| 2002/0067615 A1 * | 6/2002 | Muller | ........................ 362/486 |
| 2003/0090198 A1 * | 5/2003 | Aston | ......................... 313/498 |

FOREIGN PATENT DOCUMENTS

| | | |
|---|---|---|
| EP | 1 094 436 A2 | 4/2001 |
| EP | 1 120 838 A2 | 8/2001 |
| JP | 04070823 | * 3/1992 |
| WO | 99/57945 | 11/1999 |

* cited by examiner

*Primary Examiner*—Vip Patel
(74) *Attorney, Agent, or Firm*—Thomas H. Close; Andrew J. Anderson

(57) ABSTRACT

Lighting apparatus includes: a solid state area illumination light source having, a substrate, an organic light emitting diode (OLED) layer deposited upon the substrate, the organic light emitting diode layer including first and second electrodes for providing electrical power to the OLED layer, an encapsulating cover covering the OLED layer, and first and second conductors located on the substrate and electrically connected to the first and second electrodes and extending beyond the encapsulating cover for making electrical contact to the first and second electrodes by an external power source; and a socket for removably receiving and holding the light source and having first electrical contacts for making electrical connection to the first and second conductors of the light source, and second electrical contacts for making electrical connection to an external power source.

45 Claims, 9 Drawing Sheets

OLED LIGHTING APPARATUS

FIELD OF THE INVENTION

The present invention relates to the use of organic light emitting diodes for area illumination.

BACKGROUND OF THE INVENTION

Solid-state lighting devices made of light emitting diodes are increasingly useful for applications requiring robustness and long-life. For example, solid-state LEDs are found today in automotive applications. These devices are typically formed by combining multiple, small LED devices providing a point light source into a single module together with glass lenses suitably designed to control the light as is desired for a particular application (see, for example WO99/57945, published Nov. 11, 1999). These multiple devices are expensive and complex to manufacture and integrate into single area illumination devices. Moreover, LED devices provide point sources of light, a plurality of which are employed for area illumination.

Organic light emitting diodes (OLEDs) are manufactured by depositing organic semiconductor materials between electrodes on a substrate. This process enables the creation of light sources having extended surface area on a single substrate. The prior art describes the use of electro-luminescent materials as adjuncts to conventional lighting (for example U.S. Pat. No. 6,168,282, issued Jan. 2, 2001 to Chien). In this case, because of the limited light output from the electro-luminescent material, it is not useful for primary lighting.

EP1120838A2, published Aug. 1, 2001 describes a method for mounting multiple organic light emitting devices on a mounting substrate to create a light source. However, this approach of mounting multiple light sources on a substrate increases the complexity and hence the manufacturing costs of the area illumination light source.

It would also be useful if a light source is compatible with existing lighting infrastructure, for example the common screw-type base (standard E26) and the pin-type bayonet base (standard B22). Moreover, the light source should preferably be readily and safely replaceable by a consumer at minimal cost.

There is a need therefore for an improved, replaceable OLED lighting apparatus having a simple construction using a single substrate, compact, and compatible with the existing lighting infrastructure.

SUMMARY OF THE INVENTION

The need is met by providing lighting apparatus that includes: a solid state area illumination light source having, a substrate, an organic light emitting diode (OLED) layer deposited upon the substrate, the organic light emitting diode layer including first and second electrodes for providing electrical power to the OLED layer, an encapsulating cover covering the OLED layer, and first and second conductors located on the substrate and electrically connected to the first and second electrodes and extending beyond the encapsulating cover for making electrical contact to the first and second electrodes by an external power source; and a socket for removably receiving and holding the light source and having first electrical contacts for making electrical connection to the first and second conductors of the light source, and second electrical contacts for making electrical connection to an external power source.

Advantages

The present invention has the advantage of providing an inexpensive, long lived, highly efficient, light source that is replaceable, compact, and is compatible with existing lighting infrastructure.

It will be understood that the figures are not to scale since the individual layers are too thin and the thickness differences of various layers too great to permit depiction to scale.

DETAILED DESCRIPTION OF THE INVENTION

Figure 1:
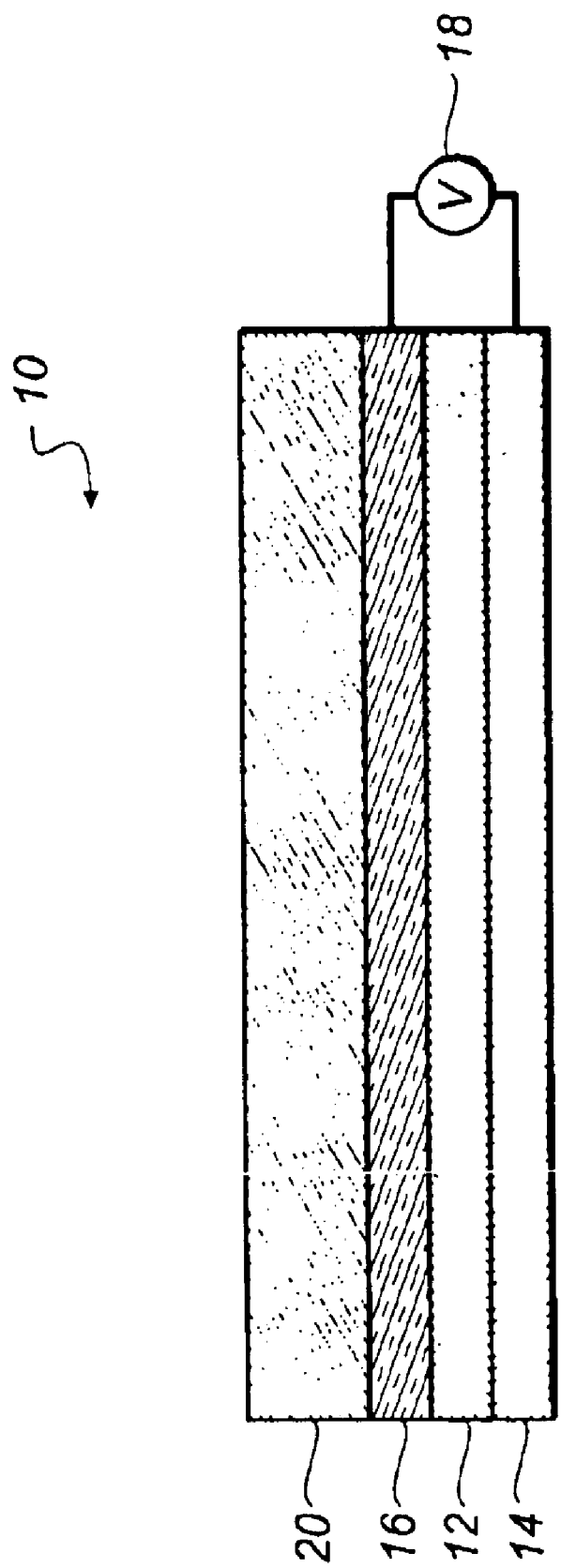
FIG. 1 illustrates a partial cross section of a prior art OLED area illumination light source.

FIG. 1 is a schematic diagram of a prior art OLED light source including an organic light emitting layer 12 disposed between two electrodes, e.g. a cathode 14 and an anode 16. The organic light emitting layer 12 emits light upon application of a voltage from a power source 18 across the electrodes. The OLED light source 10 typically includes a substrate 20 such as glass or plastic. It will be understood that the relative locations of the anode 16 and cathode 14 may be reversed with respect to the substrate. The term OLED light source refers to the combination of the organic light emitting layer 12, the cathode 14, the anode 16, and other layers described below.

Figure 2:
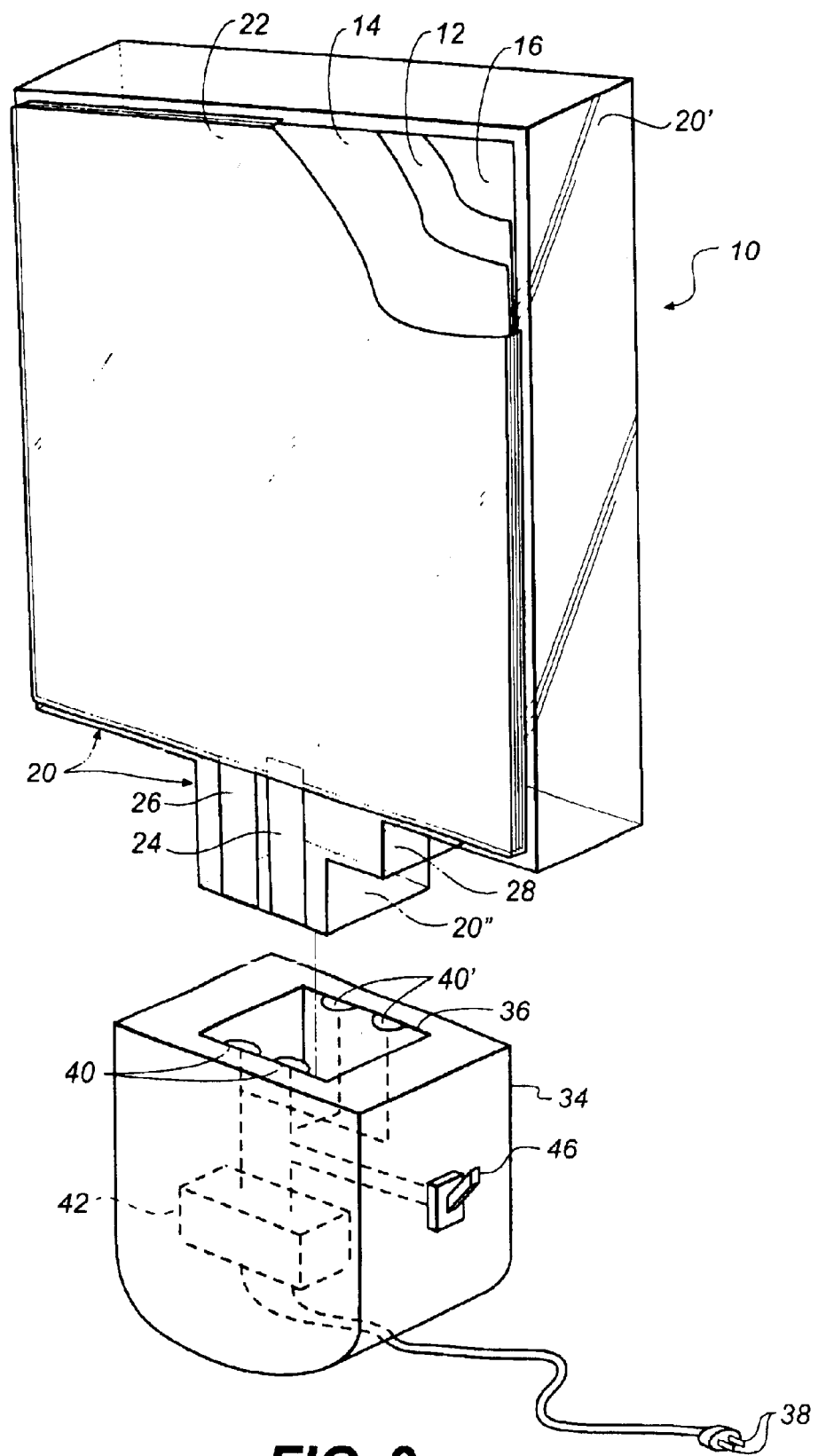
FIG. 2 is perspective view of lighting apparatus according to one embodiment of the present invention.

Referring to FIG. 2, a perspective view of lighting apparatus according to one embodiment of the present invention is shown. The lighting apparatus includes an OLED light source 10 of the type shown in FIG. 1 and a socket 34 for removably receiving and holding the light source 10.

According to one embodiment of the present invention, the light source 10, includes a substrate 20, the substrate defining a body portion 20' and a tab portion 20". An organic light emitting layer 12 is disposed between a cathode 14 and an anode 16. An encapsulating cover 22 is provided over the light source 10 on the body portion 20' of the substrate 20.

The cover 22 may be a separate element such as a hermetically sealed cover plate affixed over the layers 12, 14, and 16 or the cover may be coated over the layers 12, 14, and 16 as an additional layer. The OLED light emitting layer 12 is continuous over the substrate to provide a continuous light emitting area. First and second conductors 24 and 26 located on the substrate 20 are electrically connected to the first and second electrodes 14 and 16, and extend on tab portion 20" beyond the encapsulating cover 22 for making electrical contact to the first and second electrodes by an external power source (not shown).

In a preferred embodiment of the present invention, the tab portion 20" defines an orientation feature such as step 28 to insure that the illumination source is inserted in the socket 34 in the correct orientation. To allow light to be emitted from the OLED light source 10, the substrate 20, the electrodes 14 and 16, and the cover 22 are transparent. In applications where it is not required to emit light from both sides of the substrate, one or more of the substrate, cover, anode, or cathode may be opaque or reflective. The cover and/or substrate may also be light diffusers.

The socket 34 defines an aperture 36 for receiving the tab portion 20" and includes first electrical contacts 40 located in the aperture 36 for making electrical connection to the first and second conductors 24 and 26 of the light sources. The socket 34 also includes second electrical contacts 38 which are electrically connected to first electrical contacts 40 for making electrical connection to the external power source (not shown).

Figure 3:
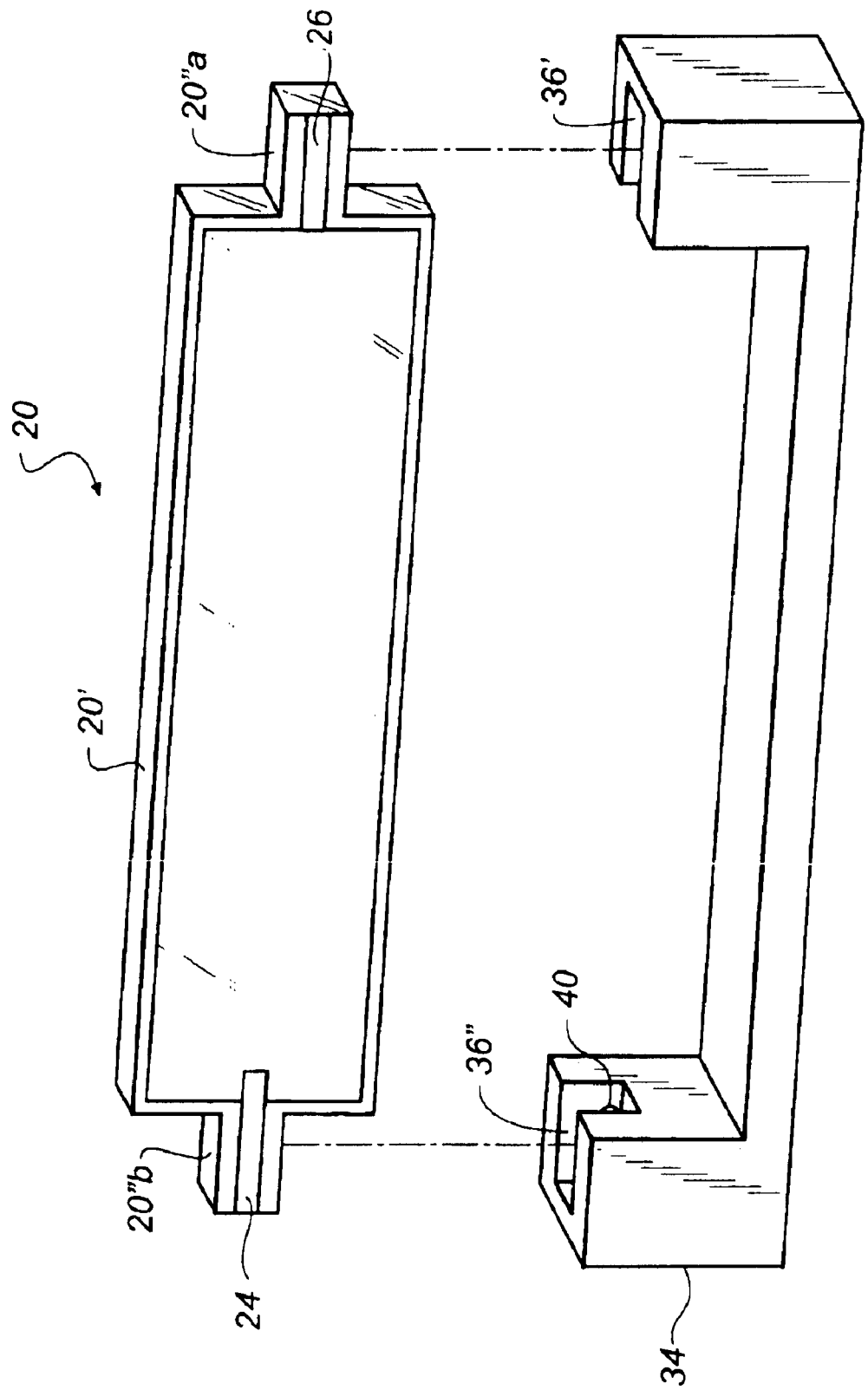
FIG. 3 is a perspective view of lighting apparatus according to an alternative embodiment of the present invention having an elongated light source with contacts at either end.

Duplicate first electrical contacts 40' may be provided in the aperture 36 so that the tab portion 20" (assuming it does not include an orientation feature 28) may be inserted in either orientation into the aperture 36 and will still connect appropriately to the external power source. The light source 10 is physically inserted into or removed from the socket 34 by pushing or pulling the tab portion of the substrate into or out of the socket 34. The light source and the socket 34 are preferably provided with a detent (not shown) to hold the light source in the socket FIG. 3 illustrates an alternative embodiment of the present invention wherein the substrate 20 has a long thin body portion 20' with two tabs 20"a and 20"b located at opposite ends of the body portion 20'. A socket 34 includes a pair of apertures 36' and 36" for receiving and holding the tabs. As shown in FIG. 3, one of the conductors 24 and 26 is located on each tab.

Figure 4:
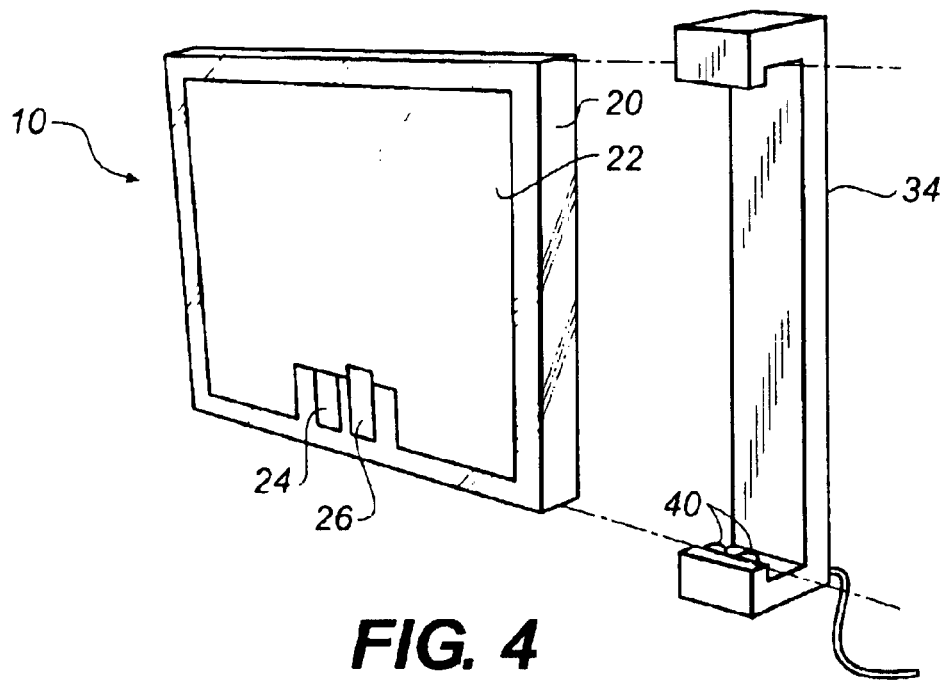
FIG. 4 is a perspective view of lighting apparatus according to an alternative embodiment of the present invention having a bracket type socket with conductors located at one edge of the light source.
Figure 5:
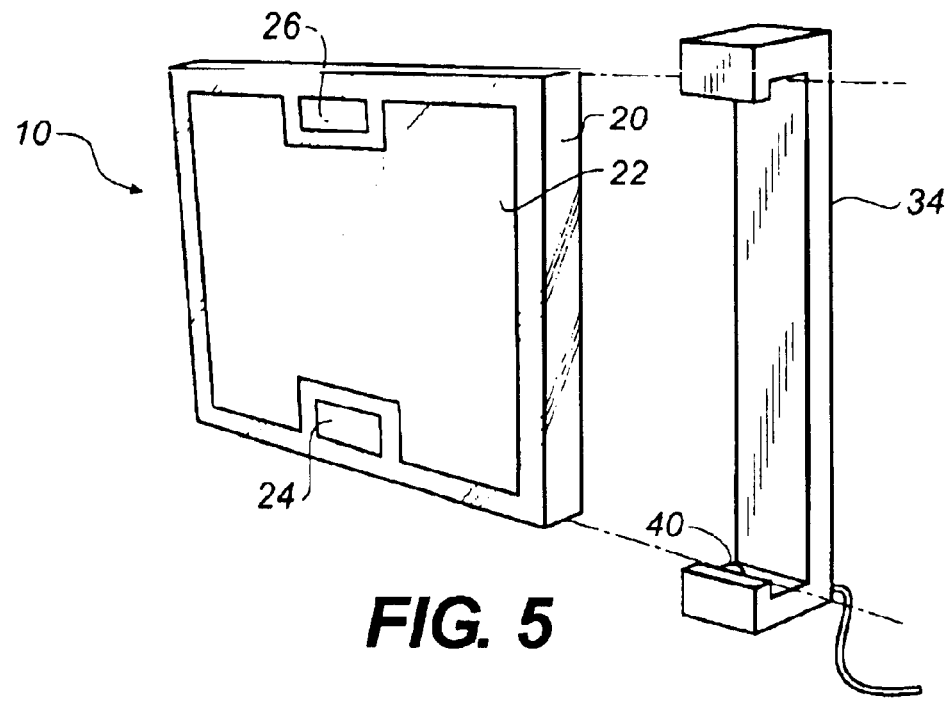
FIG. 5 is a perspective view of lighting apparatus according to an alternative embodiment of the present invention having a bracket type socket with conductors located at opposite edges of the light source.

Referring to FIG. 4, in a further alternative embodiment of the lighting apparatus, the substrate 20 does not include a tab portion, and the first and second conductors are located on the edge of the substrate 20. The light source 10 includes a substrate 20 with first and second conductors 24 and 26 located on the edge of the substrate 20 and is held by its edges in a C-shaped socket 34 such that the electrical contacts 40 make an electrical connection to the first and second conductors 24 and 26. FIG. 5 illustrates an alternative arrangement wherein the first and second conductors 24 and 26 are located at opposite edges of the substrate 20 and C-shaped socket 34 is provided with contacts 40 located in opposite arms of the socket 34. The light source 10 may emit light from only one side (e.g. the side facing away from the socket) and the first and second conductors located on the opposite side.

To minimize cost of manufacture, assembly, and design and to maximize the robustness of the light source 10, according to the present invention, the materials are deposited onto a single unitary substrate 20 (rather than applying separate tiled display elements to a second substrate as taught in the prior art).

Figure 6:
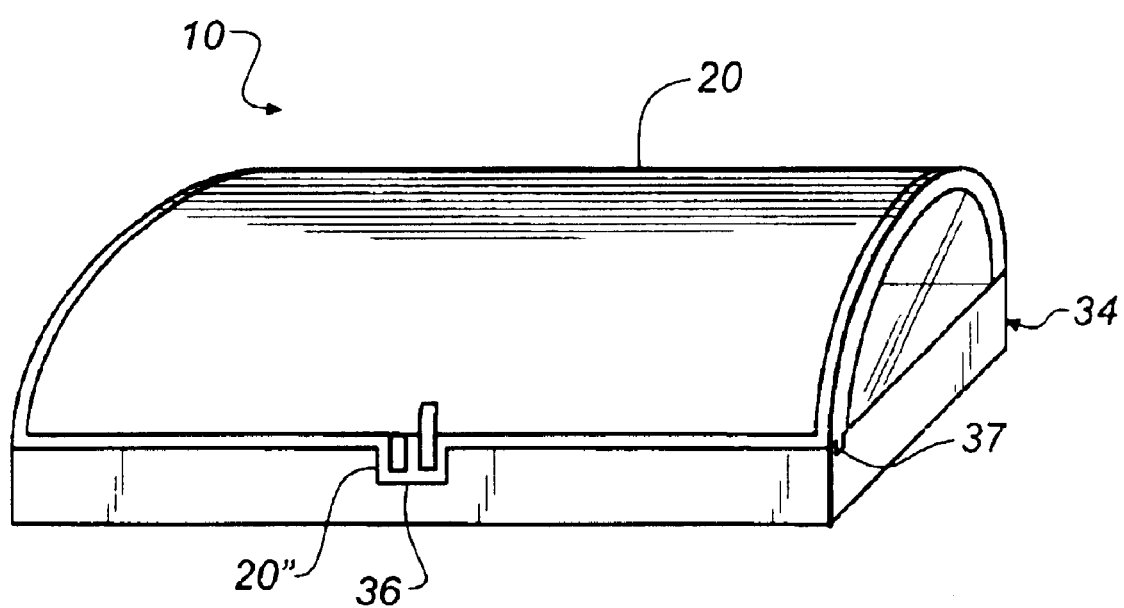
FIG. 6 is a perspective view of lighting apparatus according to an alternative embodiment of the present invention having a light source with a flexible substrate that is held in a curved configuration in the socket.

The substrate 20 can be either rigid or flexible. Rigid substrates, such as glass, provide more structural strength and are generally planar and may have a variety of shapes other than rectangular. The present invention may also be used with a flexible substrate, such as plastic, that can be bent into a variety of shapes. In the case wherein the substrate is flexible, the socket 34 may include a support to hold the substrate in a desired configuration, for example, as shown in FIG. 6, a flexible substrate 20 is curved into a cylindrical shape and supported by socket 34. Electrical power is provided to the socket and conducted to a tab 20" in the substrate through an aperture 36 in the socket 34. Alternatively, the electrical contact to the light source 10 may be provided at an edge of the flexible substrate as shown in FIGS. 4 and 5. Socket 34 may be provided with support features such as channels 37 which receive the edges of the light source 10. The electrical contacts to the light source may be provided in the channels.

Referring back to FIG. 2, the lighting apparatus may include a power converter 42 to convert the electrical power from the external power source to a form suitable for powering the OLED light source 10. In a preferred embodiment, the external power source is a standard power source, for example, the power supplied to a house or office at 110 V in the United States or 220 V in the United Kingdom. Other standards such as 24 V DC, 12 V DC and 6 V DC found in vehicles, for example, may also be used.

The OLED light source 10 may require a rectified voltage with a particular waveform and magnitude; the converter 42 can provide the particular waveform using conventional power control circuitry. The particular waveform may periodically reverse bias the light emitting organic materials to prolong the life-time of the OLED materials in the light source 10. The converter 42 is preferably located in the socket 34. The socket 34 may also include a switch 46 for controlling the power to the light source 10.

Figure 9:
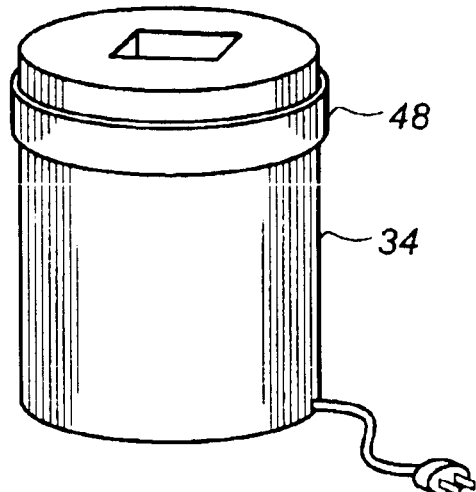
FIG. 9 is a perspective view of a socket including a brightness control switch according to an embodiment of the present invention.
Figure 10:
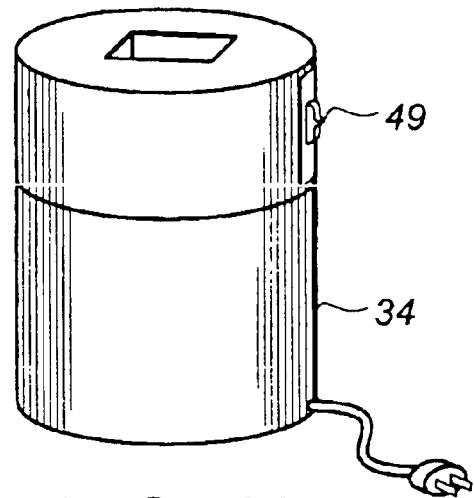
FIG. 10 is a perspective view of a socket including an on/off switch according to an embodiment of the present invention.

The brightness of the lighting apparatus may be controlled by varying the power provided to the OLED light source 10. In particular, pulse-width modulation schemes well known in the art may be employed (see for example, EP1094436A2, published Apr. 25, 2001) and implemented by the converter 42. Alternatively, the amount of power provided to the light emitting area may be reduced, for example by reducing the voltage or limiting the current supplied to the OLED light source 10. Brightness control may be provided by a control element such as a rotary, variable resistance switch integrated into the socket, as shown for example as a ring 48 in FIG. 9 or a slider 49 in FIG. 10.

The OLED light source 10 can be provided as a standard element and sockets 34 customized to markets with differing power systems. OLED light sources 10 may be provided with different shapes or other attributes useful in specific applications and may be employed with a common socket, thereby decreasing costs and improving usefulness of the lighting apparatus.

Figure 7:
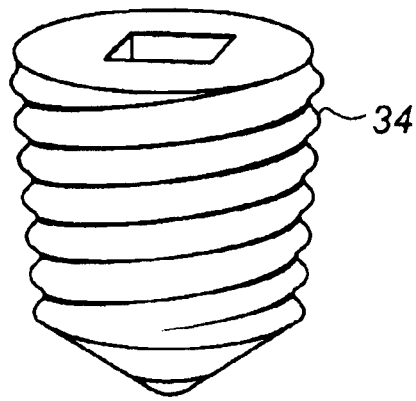
FIG. 7 is a perspective views of a socket having the configuration of a standard light bulb screw base according to an embodiment of the present invention.
Figure 8:
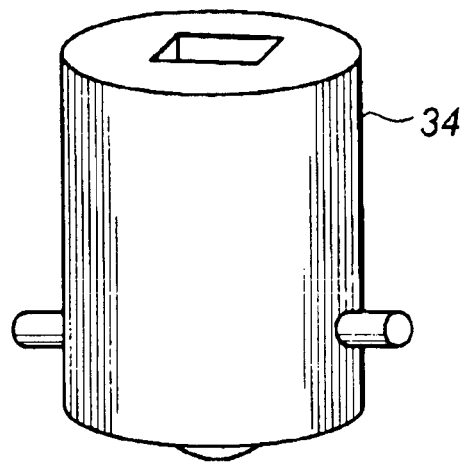
FIG. 8 is a perspective view of a socket having the configuration of a standard light bulb pin base according to an embodiment of the present invention.
Figure 11:
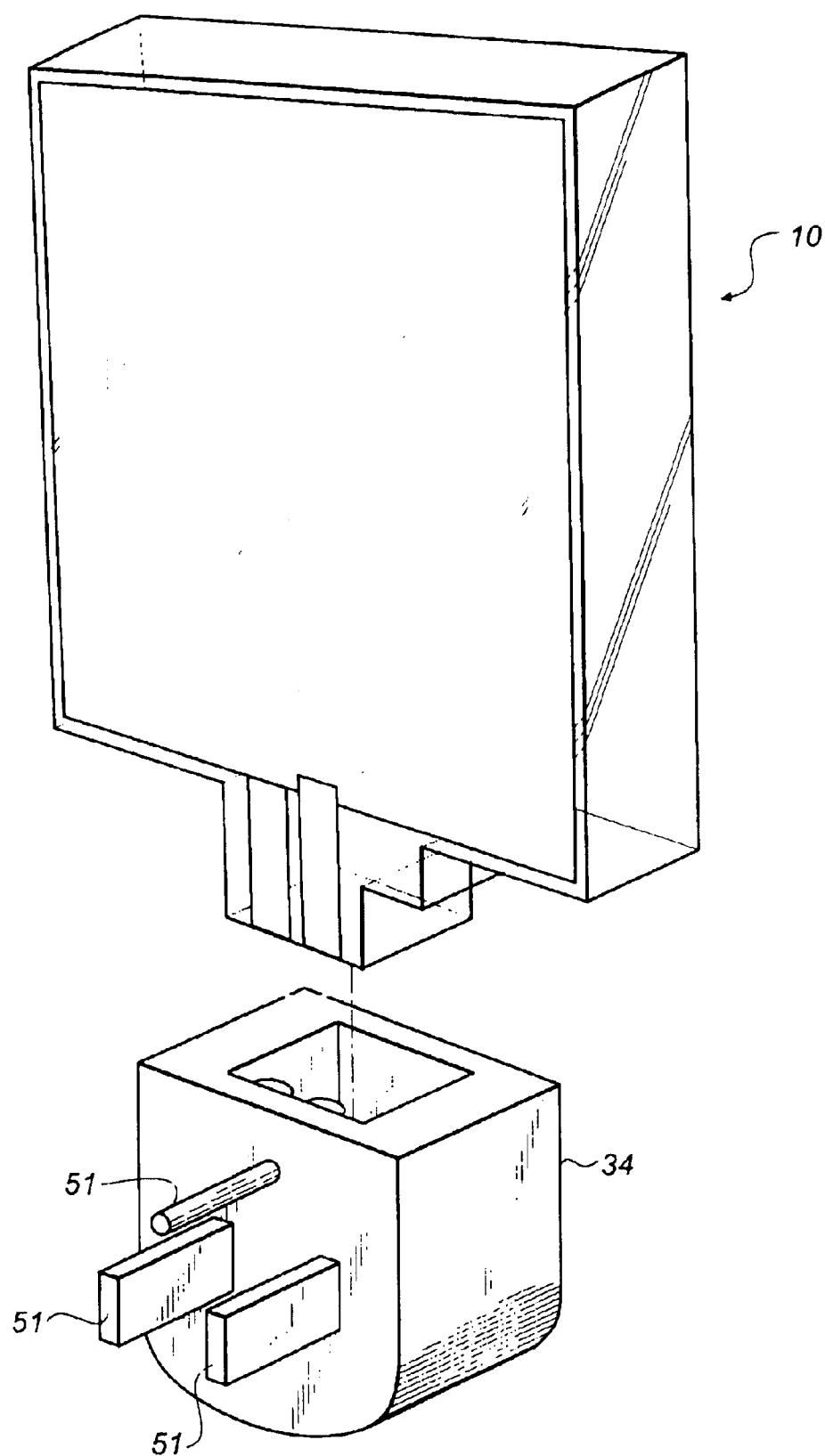
FIG. 11 is a perspective view of a socket having a standard plug according to an embodiment of the present invention.

The socket 34 can be a part of a lighting fixture. Alternatively, the socket 34 may be adapted to be received by and make electrical contact with a standard light socket such as a conventional US standard screw type lamp socket as shown in FIG. 7, or a pin-type socket as shown in FIG. 8. A wide variety of standard lamp bases are known in the prior art and may be used with the socket of the present invention. The socket 34 may also include the prongs 51 of a conventional power plug and be adapted to be inserted directly into a wall socket or extension cord socket as shown in FIG. 11.

The cover, substrate, or one of the electrodes may be reflective or be provided with a reflective surface so that light emitted by the OLED layer will be emitted from only one side of the light source 10.

Figure 12:
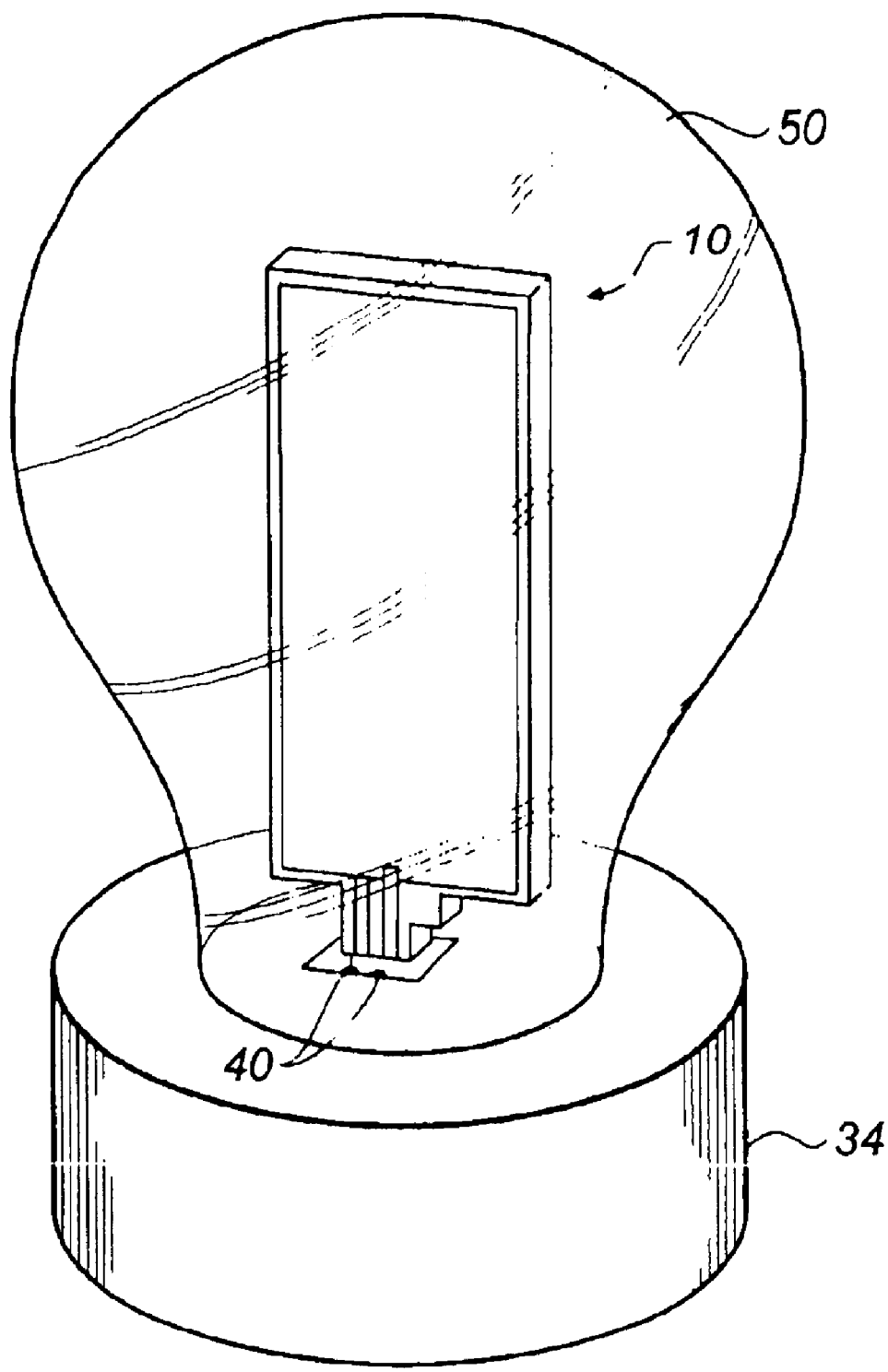
FIG. 12 is a perspective view a of an area illumination light source according to the present invention including a housing.

Referring to FIG. 12, a transparent or translucent screen or housing 50 may be provided around the OLED light source 10 to diffuse the light and provide additional physical protection and/or aesthetic appeal to the light source. The housing 50 may take a variety of shapes, for example the shape of a standard light bulb as shown in FIG. 12, or a cylinder or rectangular box (not shown).

The present invention may be employed in a wide variety of conventional applications, for example in a table-top lamp, floor-lamp, chandelier, under-counter lamp, or ceiling light. The present invention may also be employed in portable illumination devices using DC power sources.

In a preferred embodiment, the OLED layer comprises Organic Light Emitting Diodes (OLEDs) which are composed of small molecule OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al.

OLED Element Architecture

Figure 13:
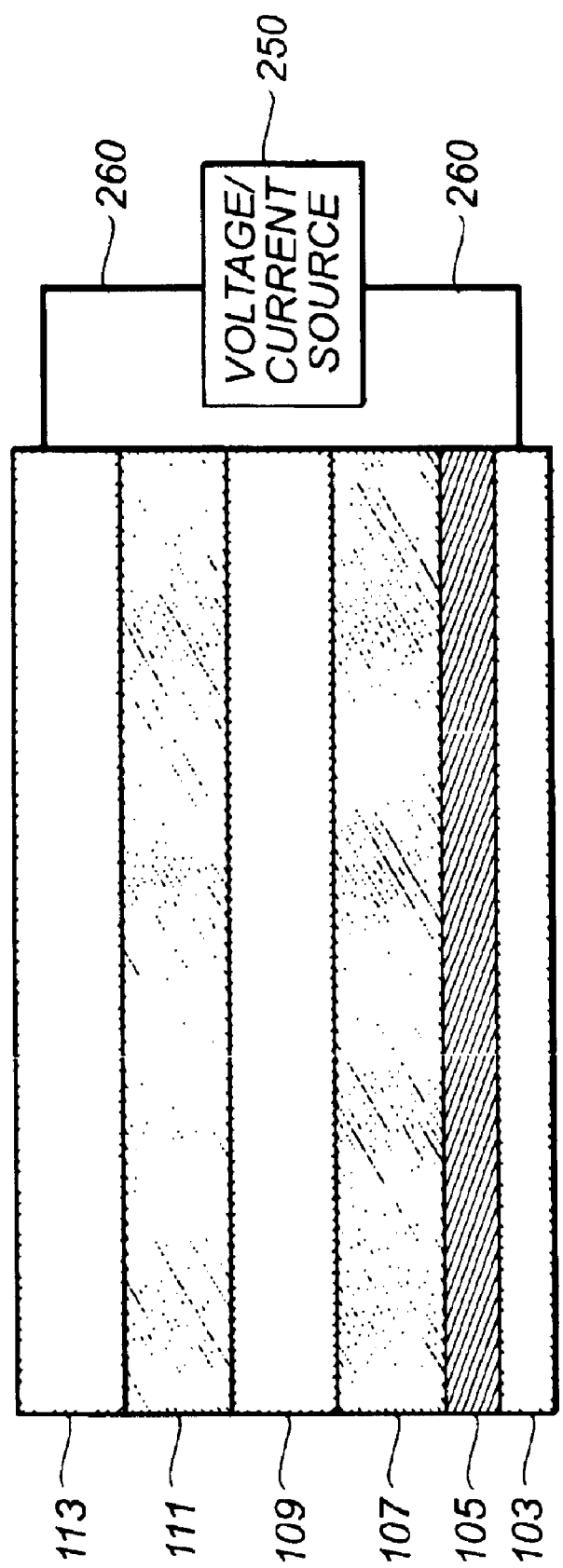
FIG. 13 is a cross sectional view of an area illumination light source used in a preferred embodiment of the present invention.

There are numerous configurations of OLED elements wherein the present invention can be successfully practiced. A typical, non-limiting structure is shown in FIG. 13 and is comprised of an anode layer 103, a hole-injecting layer 105, a hole-transporting layer 107, a light-emitting layer 109, an electron-transporting layer 111, and a cathode layer 113. These layers are described in detail below. The total combined thickness of the organic layers is preferably less than 500 nm. A voltage/current source 250 is required to energize the OLED element and conductive wiring 260 is required to make electrical contact to the anode and cathode.

Substrate

Substrate 20 is preferably light transmissive but may also be opaque or reflective. Substrates for use in this case include, but are not limited to, glass, plastic, semiconductor materials, ceramics, and circuit board materials.

Anode

The anode layer 103 is preferably transparent or substantially transparent to the light emitted by the OLED layer(s). Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. When the anode is not transparent, the light transmitting characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

It is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520. A more preferred class of aromatic tertiary amines are those which include at least two aromatic tertiary amine moieties as described in U.S. Pat. Nos. 4,720,432 and 5,061,569. Illustrative of useful aromatic tertiary amines include, but are not limited to, the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl 4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphtbalene
2,6-Bis[di-(1-naphthyl)amino]naphthalene
2,6-Bis[N-(1-naphthyl)-N-(2-naphthyl)amino] naphthalene
N,N,N',N'-Tetra(2-naphthyl)-4,4''-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Iridium complexes of phenylpyridine and its derivatives are particularly useful luminescent dopants. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,769,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar oxine derivatives constitute one class of useful host compounds capable of supporting electroluminescence, and are particularly suitable. Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-$\mu$-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2''-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 111 and 109 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

Preferably, the cathode 113 is transparent and can comprise nearly any conductive transparent material. Alternatively, the cathode 113 may be opaque or reflective. Suitable cathode materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) and a thicker layer of conductive metal.

The EIL is situated between the cathode and the organic layer (e.g., ETL). Here, the EIL preferably includes a low work function metal or metal salt, and if so, the thicker conductor layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When cathode layer 113 is transparent or nearly transparent, metals must be thin or transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Deposition can also be achieved using thermal dye transfer from a donor sheet (see U.S. Pat. Nos. 5,851,709 and 6,066,357) and inkjet method (see U.S. Pat. No. 6,066,357).

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, or providing colored, neutral density, or color conversion filters over the device. Filters, may be specifically provided over the cover or substrate or as part of the cover or substrate.

The invention has been described in detail with particular reference to certain preferred embodiments thereof, but it will be understood that variations and modifications can be effected within the spirit and scope of the invention.

Parts List

10 OLED light source
12 organic light emitting layer
14 cathode
16 anode
18 power source
20 substrate
20' body portion of substrate
20" tab portion of substrate
20"a tab portion of substrate
20"b tab portion of substrate
22 encapsulating cover
24 first conductor
26 second conductor
28 step
34 socket
36 aperture
36' aperture
36" aperture
37 channels
38 contacts
40 contacts
40' contacts
42 converter
46 switch
48 ring
49 slider
50 housing
51 prongs
103 anode
105 hole-injecting layer
107 hole-transporting layer
109 light-emitting layer
111 electron-transporting layer
113 cathode layer
250 voltage/current source
260 conductive wiring

What is claimed is:

1. Lighting apparatus, comprising:
a) a solid state area illumination light source having,
   i) a substrate;
   ii) an organic light emitting diode (OLED) layer deposited upon the substrate, the organic light emitting diode layer including first and second electrodes for providing electrical power to the OLED layer;
   iii) an encapsulating cover covering the OLED layer; and
   iv) first and second conductors located on the substrate and electrically connected to the first and second electrodes, and extending beyond the encapsulating cover for making electrical contact to the first and second electrodes by an external power source; and
b) a socket for removably receiving and holding the light source and having first electrical contacts for making direct physical and electrical connection to the first and second conductors of the light source, and second electrical contacts for making electrical connection to an external power source.

2. The lighting apparatus claimed in claim 1, wherein the substrate defines a body portion and one or more tab portions; the first and second conductors being located on the tab portion(s) and wherein the socket defines an aperture for receiving the tab.

3. The lighting apparatus claimed in claim 2, wherein the substrate defines tabs that are located at opposite edges of the substrate.

4. The lighting apparatus claimed in claim 3, wherein the first and second conductors are located at opposite edges of the substrate.

5. The lighting apparatus claimed in claim 2, wherein the tab portion of the substrate defines an orientation feature and the aperture defines a complementary orientation feature.

6. The lighting apparatus claimed in claim 1, wherein the first and second conductors are located at one or more edges of the substrate.

7. The lighting apparatus claimed in claim 1, wherein the light source emits light from one side of the substrate and the first and second conductors are located on an opposite side of the substrate.

8. The lighting apparatus claimed in claim 1, wherein the substrate is rigid and planar.

9. The lighting apparatus claimed in claim 1, wherein the cover is a coated layer.

10. The lighting apparatus claimed in claim 1, wherein the cover is a hermetically sealed cover plate.

11. The lighting apparatus claimed in claim 1, wherein the OLED layer is continuous over the substrate.

12. The lighting apparatus claimed in claim 1, wherein the light source operates on standard power selected from the group consisting of 110 volt AC, 220 volt AC, 24 volt DC, 12 volt DC, and 6 volt DC.

13. The lighting apparatus claimed in claim 1, wherein the substrate is transparent and the light source emits light through the substrate.

14. The lighting apparatus claimed in claim 13, wherein the transparent substrate includes a light diffusing surface.

15. The lighting apparatus claimed in claim 1, wherein the encapsulating cover is transparent and the light source emits light through the encapsulating cover.

16. The lighting apparatus claimed in claim 15, wherein the transparent cover includes a light diffusing surface.

17. The lighting apparatus claimed in claim 1, wherein the substrate is flexible.

18. The lighting apparatus claimed claim 1, further comprising a transparent or translucent housing enclosing the light source.

19. The lighting apparatus claimed in claim 1, further comprising: a converter connected between the first and second electrical contacts for converting power from the external power source to a form useable by the OLED layer.

20. The lighting apparatus claimed in claim 19, wherein the converter is located in the socket.

21. The lighting apparatus claimed in claim 19, wherein the converter converts AC line voltage to a voltage useable by the OLED layer.

22. The lighting apparatus claimed in claim 1, wherein the socket includes a power switch to control power to the first and second conductors.

23. The lighting apparatus claimed in claim 1, wherein the socket includes a brightness control unit.

24. The lighting apparatus claimed in claim 23, wherein the brightness control unit includes a variable resistive switch.

25. The lighting apparatus claimed in claim 24, wherein the variable resistive switch is operated by a rotating ring located on the socket.

26. The lighting apparatus claimed in claim 1, wherein the socket is adapted to be received by and make electrical contact with a standard light socket.

27. The lighting apparatus claimed in claim 1, further comprising third electrical contacts for making contact with the first and second conductors when the tab portion is inserted into the aperture of the socket in a different orientation.

28. A solid state area illumination light source having, a) a substrate;

b) an organic light emitting diode (OLED) layer deposited upon the substrate, the organic light emitting diode layer including first and second electrodes for providing electrical power to the OLED layer;

c) an encapsulating cover covering the OLED layer; and d) first and second conductors located on the substrate and electrically connected to the first and second electrodes, and extending beyond the encapsulating cover for making electrical contact to the first and second electrodes by an external power source; and e) wherein the substrate defines a body portion and one or more tab portions adapted to be received by a socket having electrical contacts connected to an external power source; the first and second conductors being located on the tab portion(s) for making direct physical and electrical contact with the electrical contacts in the socket.

29. The light source claimed in claim 28, wherein the substrate defines tabs that are located at opposite edges of the substrate.

30. The light source claimed in claim 28, wherein the first and second conductors are located at one or more edges of the substrate.

31. The light source claimed in claim 30, wherein the first and second conductors are located at opposite edges of the substrate.

32. The light source claimed in claim 28, wherein the light source emits light from one side of the substrate and the first and second conductors are located on an opposite side of the substrate.

33. The light source claimed in claim 28, wherein the substrate is rigid and planar.

34. The light source claimed in claim 28, wherein the cover is a coated layer.

35. The light source claimed in claim 28, wherein the cover is a hermetically sealed cover plate.

36. The light source claimed in claim 28, wherein the OLED layer is continuous over the substrate.

37. The light source claimed in claim 28, wherein the light source operates on standard power selected from the group consisting of 110 volt AC, 220 volt AC, 24 volt DC, 12 volt DC, and 6 volt DC.

38. The light source claimed in claim 28, wherein the substrate is transparent and the light source emits light through the substrate.

39. The light source claimed in claim 38, wherein the transparent substrate includes a light diffusing surface.

40. The light source claimed in claim 28, wherein the encapsulating cover is transparent and the light source emits light through the encapsulating cover.

41. The light source claimed in claim 40, wherein the transparent cover includes a light diffusing surface.

42. The light source claimed in claim 28, wherein the substrate is flexible.

43. The light source claimed claim 28, further comprising a transparent or translucent housing enclosing the light source.

44. The light source claimed in claim 29, wherein the tab portion of the substrate defines an orientation feature and the aperture defines a complementary orientation feature.

45. The light source claimed in claim 28, further comprising third electrical contacts for making contact with the first and second conductors when the tab portion is inserted into the aperture of the socket in a different orientation.

* * * * *